United States Patent
Nasu et al.

(10) Patent No.: US 9,435,854 B2
(45) Date of Patent: Sep. 6, 2016

(54) ELECTRICAL CONTACTOR AND CONTACT METHOD FOR THE SAME

(71) Applicant: Kabushiki Kaisha Nihon Micronics, Tokyo (JP)

(72) Inventors: Mika Nasu, Tokyo (JP); Akihiro Karouji, Tokyo (JP); Takayuki Hayashizaki, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 431 days.

(21) Appl. No.: 13/914,952

(22) Filed: Jun. 11, 2013

(65) Prior Publication Data

US 2014/0009182 A1 Jan. 9, 2014

(30) Foreign Application Priority Data

Jul. 6, 2012 (JP) .................................. 2012-152926

(51) Int. Cl.
    *G01R 31/02* (2006.01)
    *G01R 31/28* (2006.01)
    *G01R 1/067* (2006.01)

(52) U.S. Cl.
    CPC ........... *G01R 31/2889* (2013.01); *G01R 1/067* (2013.01); *G01R 1/06727* (2013.01); *G01R 31/2891* (2013.01)

(58) Field of Classification Search
    CPC .......... G01R 31/2886; G01R 31/2887; G01R 1/07314; G01R 1/067; G01R 1/0408; G01R 31/2863; G01R 1/06794; G01R 31/2851
    See application file for complete search history.

(56) References Cited

U.S. PATENT DOCUMENTS

2007/0152686 A1* 7/2007 Kister ................ G01R 1/07357
324/755.01

FOREIGN PATENT DOCUMENTS

| JP | 6053853 A | 3/1985 |
|---|---|---|
| JP | 2005-338039 | 12/2005 |
| JP | 2009-229410 | 10/2009 |
| JP | 2010-025614 | 2/2010 |

OTHER PUBLICATIONS

First OA Issued in Japanese Patent Application No. 2012-152926 Dated Jan. 5, 2016.

* cited by examiner

*Primary Examiner* — Tung X Nguyen
(74) *Attorney, Agent, or Firm* — Bacon & Thomas, PLLC

(57) ABSTRACT

An electrical contactor has a contact portion that is pressed onto a terminal of an electronic device and is electrically connected. When the dimension of the contact portion is S1, the contact dimension of the contact portion and the terminal of the electronic device is V, the amount of sliding of the contact portion is W, and the additional element including at least positional accuracy of the contact portion is X, the dimension of the contact portion S1 satisfies S1>V+W+X. In a contact method for the electrical contactor, when the sum of a clearance on the front end side in the sliding direction in starting contact and a clearance on the back end side in the sliding direction in ending contact is X3, the crushed area S2 of the terminal is set to satisfy a relationship of S2<S1−X3.

5 Claims, 6 Drawing Sheets (a)

(b)

D VIEW

| BUMP SIZE (μm) | CONTACT LENGTH Vmin. (μm) | CONTACT LENGTH Vave. (μm) | CONTACT LENGTH Vmax. (μm) |
|---|---|---|---|
| 20 | 2.8 | 5.4 | 8 |
| 30 | 4.2 | 8.1 | 12 |
| 40 | 5.6 | 11 | 16 |
| 50 | 7 | 14 | 20 |

| BUMP SIZE (μm) | AMOUNT OF SLIDING Wmin. (μm) | AMOUNT OF SLIDING Wave. (μm) | AMOUNT OF SLIDING Wmax. (μm) |
|---|---|---|---|
| 20 | 2 | 4 | 8 |
| 30 | 3 | 6 | 12 |
| 40 | 4 | 8 | 16 |
| 50 | 5 | 10 | 20 |

ELECTRICAL CONTACTOR AND CONTACT METHOD FOR THE SAME

CROSS-REFERENCE TO RELATED APPLICATION

This application claims, under 35 USC 119, priority of Japanese Application No. 2012-152926 filed on Jul. 6, 2012.

BACKGROUND OF THE INVENTION

1. Field of the Invention

The present invention relates to an electrical contactor and a contact method for the electrical contactor used for an electrical test of semiconductor devices such as a semiconductor integrated circuit etc.

2. Description of Related Art

An electrical test of a semiconductor device such as a conduction test etc. is conducted by applying an inspection signal and the like to each of bump electrodes in a state in which electrical contactors are electrically in contact with the bump electrodes of the semiconductor device. One example of an electrical contactor used in such an electrical test is described in Japanese Patent Laid-Open No. 2009-229410 (Patent Document 1). This electrical connecting device is outlined below.

The electrical connecting device 1 is, as shown in FIG. 1, a device electrically connecting bump electrodes of a semiconductor device 2 and a tester for the electrical test of the semiconductor device 2 which is the device to be inspected. The electrical connecting device 1 is constituted by a probe card 4 provided with a plurality of contactors 3 for the electrical test, a chuck top 5 on which the semiconductor device 2 is mounted, an inspection stage 6 allowing the chuck top 5 to perform three-dimensional movement in at least three directions of a longitudinal direction, lateral direction, and a vertical direction, and an area sensor 7 positioned on the inspection stage 6 so as to shoot at least one contactor 3.

The contactor 3, as shown in FIG. 2, is constituted by an attachment portion 9 extending in a vertical direction, a plate-shaped arm portion 10 extending toward one side of the left-right direction from a lower end portion of the attachment portion 9, a plate-shaped pedestal portion 11 protruding downward from the distal end portion of the arm portion 10, and a plate-shaped or column-shaped contact portion 13 protruding downward from a lower end portion 12 of the pedestal portion 11.

The contact portion 13 is formed to be thin and sharp. By thrusting the contact portion 13 elastically supported by the arm portion 10 into the bump electrode, the contact portion 13 enters into the bump electrode, and the contact portion 13 and the bump electrode of the semiconductor device 2 are brought into firm electrical contact with each other. In this state, conductivity test and the like is conducted.

Also, as an example of a contact probe a distal end of which enters into bump electrode are described in Japanese Patent Laid-Open No. 2010-025614 (Patent Document 2), Japanese Patent Laid-Open No. 2005-338039 (Patent Document 3), and U.S. Pat. No. 7,733,101 (Patent Document 4).

BRIEF SUMMARY OF THE INVENTION

In the conventional electrical connecting device 1 as described above, the contact portion 13 is sometimes displaced from the bump electrode and collides with the surface of the device when the contact portion 13 is brought into contact with a inclined surface of the bump electrode with spherical shape. The contact portion 13 is bent or broke by the impact of the collision when the contact portion 13 collides with the surface of the device.

Also, when the sharp contact portion 13 enters into the bump electrode, it may cause serious damage such as a large scratch, deformation and the like. If such damage occurs, the probability of being set aside gets higher in a visual inspection of an inspection process. Furthermore, in a welding process of the bump electrodes, firm connection cannot be made at the damaged part, and may cause implementation error.

This also applies to the Patent Document 2-4.

The present invention has been made in view of such problems, and an object of the present invention is to provide an electrical contactor and a contact method for the electrical contactor a contact portion of which can be brought into firm contact with a bump electrode without displacement, and can be electrically firmly connected without causing damage to the bump electrode.

An electrical contactor according to the present invention is an electrical contactor in which a contact portion on a distal end of it is, with its base end of the main body supported, pressed onto a terminal provided on a surface of an electronic device and electrically connected to it, and the contact portion is formed to have a planar surface whose area is as large as or larger than one-fourth of an area of the planar surface of the terminal of the electronic device. A contact method for an electrical contactor according to the present invention is a contact method for the electrical contactor in which a contact portion with a planar surface on a distal end portion, with the base end portion of the main body of the electrical contactor supported, pressed onto a terminal provided on a surface of an electronic device and electrically connected to it, and the contact portion crushes the terminal of the electronic device to form a planar surface whose area is as large as or larger than one-fourth of an area of a planar surface of the terminal.

In an electrical contactor and a contact method for the electrical contactor according to the present invention, the contact portion can be brought into firm contact with the bump electrode, and can be electrically firmly connected to the bump electrode without causing serious damage to the bump electrode.

DETAILED DESCRIPTION OF THE INVENTION

An electrical contactor and a contact method for the electrical contactor according embodiments of the present invention will be described below with reference to the attached drawings.

(A) Electrical Contactor

First, an electrical contactor according to this embodiment is described. A characteristic of the electrical contactor of this embodiment is a contact portion on a distal end. Thus, the entire configuration of the electrical contactor can be applied to all the existent contactors such as a cantilever type, an extension-and-compression rod type etc. A cantilever type electrical contactor, as an example, is described below.

Figure 1:
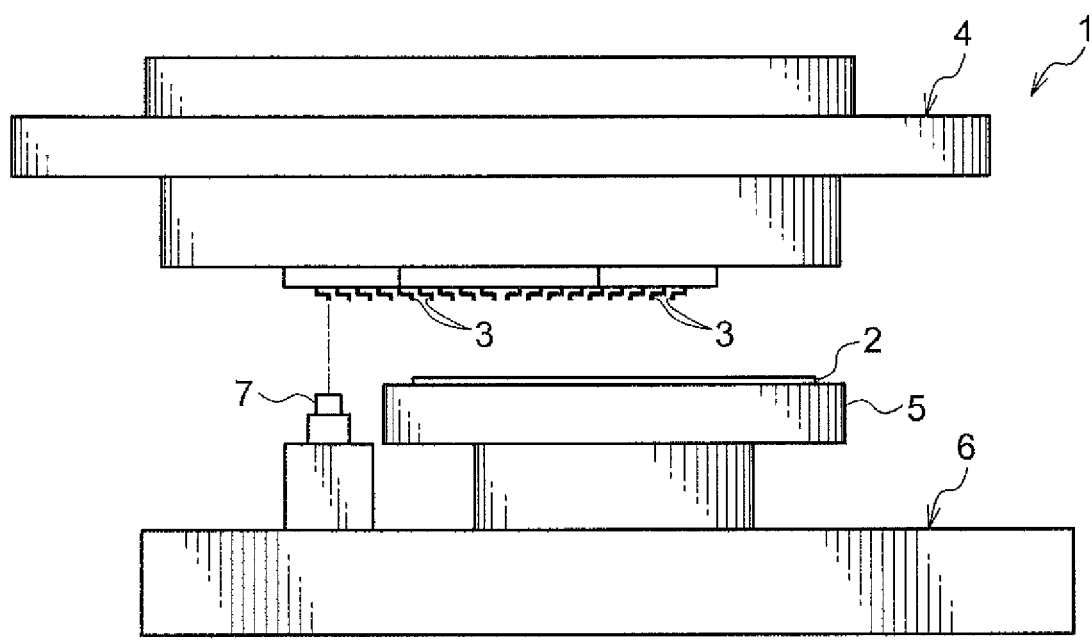
FIG. 1 is a schematic view showing a prior art electrical connecting device.
Figure 2:
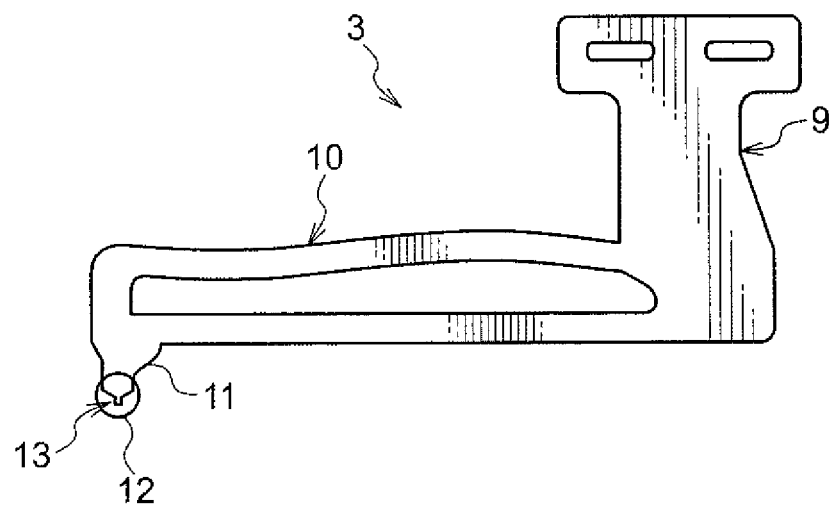
FIG. 2 is a side elevational view showing a contactor incorporated in the prior art electrical connecting device.
Figure 3:
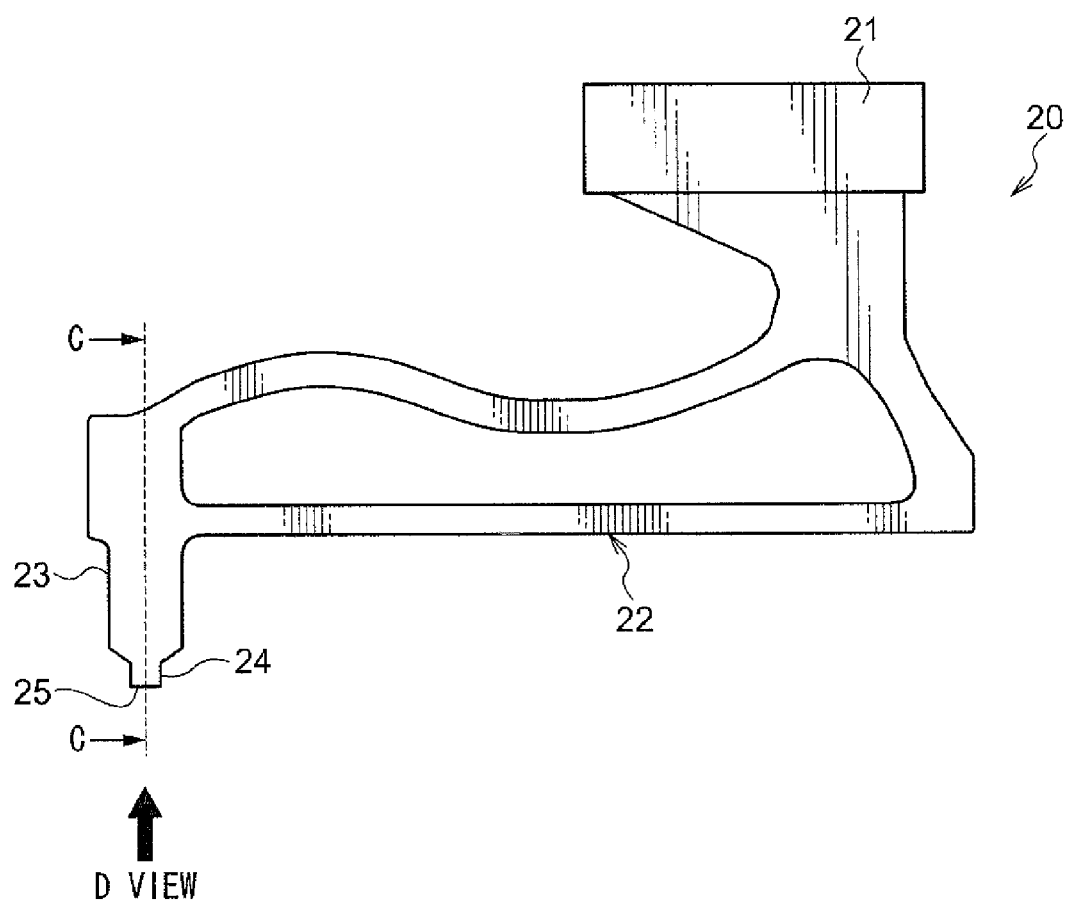
FIG. 3 is a side elevational view showing an electrical contactor according to an embodiment of the present invention.
Figure 4:
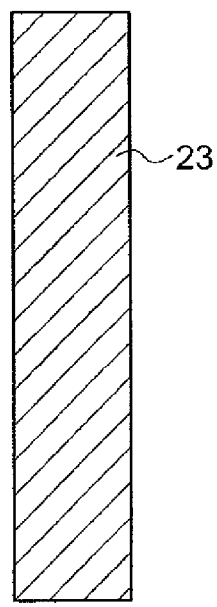
FIG. 4 is a sectional view on arrow of C-C line in FIG. 3.
Figure 5:
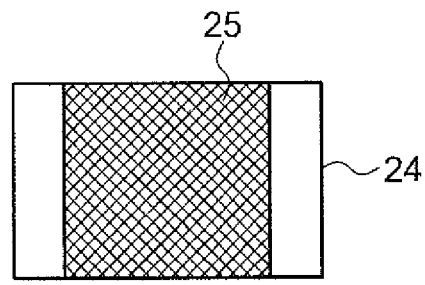
FIG. 5 is an enlarged view of a contact portion of an electrical contactor of an embodiment according to the present invention seen from the D direction of FIG. 3.

The electrical contactor of this embodiment is an contactor in which a contact portion on a distal end portion of a main body is, with its base end of the main body supported on a probe card and the like, pressed onto a terminal (a bump electrode) provided on a surface of an electronic device and electrically connected to it. The electrical contactor 20 of this embodiment, as shown in FIG. 3, is constituted by an attachment portion 21 which is the base end portion of the main body and supported on a probe card and the like, two arm portions 22 extending in a horizontal direction from an attachment portion 21, a pedestal portion 23 protruding downward from the distal end portion of the arm portion 22, and a contact portion 25 provided on a distal end portion of the main body 24 which is the lower end portion of the pedestal portion 23. Functions of each portion of this electrical contactor 20 are almost as same as that of the above-described conventional contactor 3. Thus, the same reference numerals are given to the same members, and the description will be omitted, and the contact portion 25 will be mainly described below. It is to be noted that the size of the contact portion 25 of the electrical contactor 20 according to this embodiment is a very small component with a diameter of approximately several tens of µm. Thus, the electrical contactor is, similarly to the Patent Document 1, formed by using existent techniques such as plating, etching etc.

The contact portion 25 is constituted by a planar surface formed on the distal end of the main body 24. The contact portion 25 is set, specifically, to have the dimension to satisfy the equation below.

When a dimension of the contact portion 25 is defined as S1, a dimension of a contact area of the contact portion 25 and a terminal of the electronic device (an amount of the bump electrode 27 being crushed) is defined as V, an amount of sliding of the contact portion 25 is defined as W, and an additional element including at least positional accuracy X1 of the contact portion 25 is defined as X, the dimension of the contact portion S1 is set to satisfy the relationship of S1>V+W+X.

Figure 6:
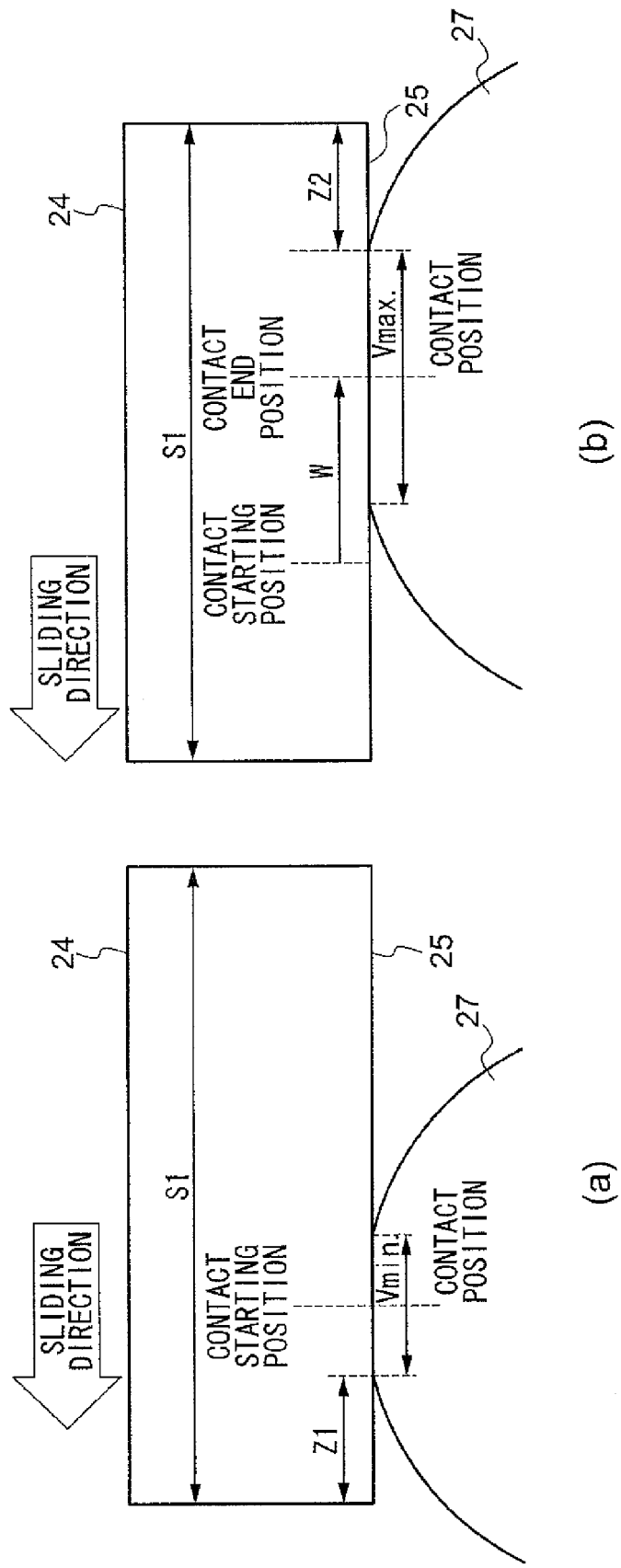
FIG. 6 is a schematic view showing a contact method for an electrical contactor according to an embodiment of the present invention.

The specific values are shown based on FIG. 6.

The contact dimension of the contact portion 25 and the terminal of the electronic device (bump electrode 27) V (the amount of the bump electrode 27 being crushed) is defined as 13.5 µm. This dimension V is specified by (7 µm+20 µm)/2=13.5 µm when the contact dimension Vmin. (see FIG. 6(*a*)) is set to be a dimension of a diameter ϕ7 µm of a circle, and a contact dimension Vmax. (see FIG. 6(*b*)) is set to be a dimension of a diameter ϕ20 µm of a circle. It is to be noted that the dimension of the diameter ϕ7 µm of the circle which is the contact dimension Vmax. and the diameter ϕ20 µm of the circle which is the contact dimension Vmin. are values of an upper and a lower limit in a state in which electrical contact between the contact portion 25 and the bump electrode 27 can be brought into contact with each other without trouble.

Figures 7, 8, 9:
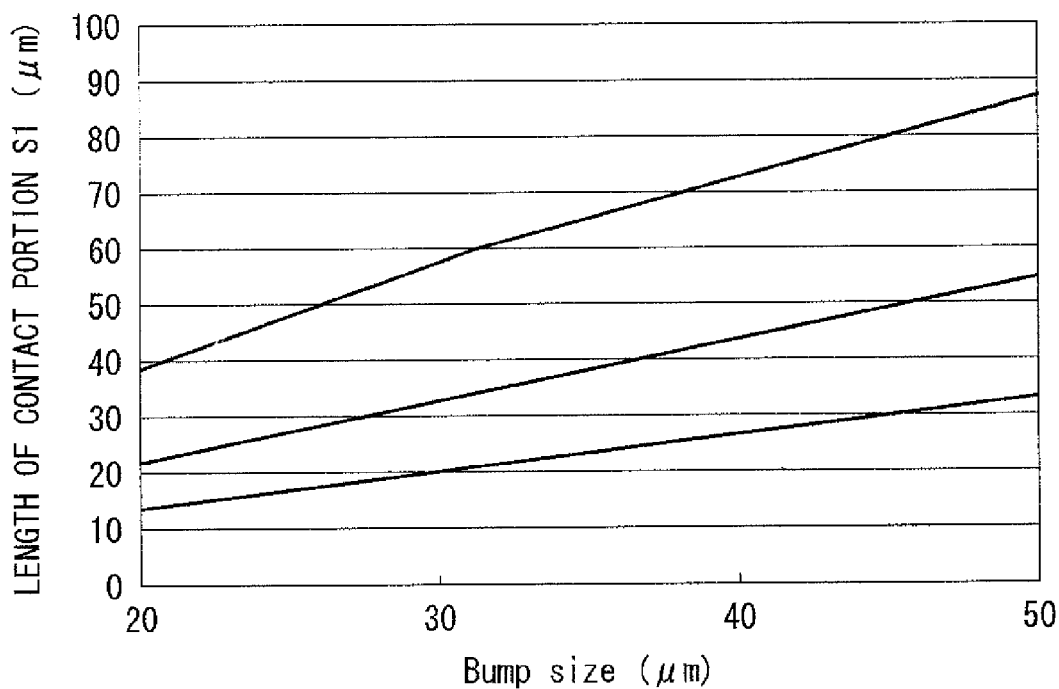
FIG. 7 is a table showing the specific values of a contact dimension V of an electrical contactor according to an embodiment of the present invention.
FIG. 8 is a table showing the specific values of amount of sliding W of an electrical contactor according to an embodiment of the present invention.
FIG. 9 is a graph showing relationship between bump size and an area of a contact portion S1.

The specific values of the contact dimension V are shown in FIG. 7. The values are examples of a case in which the bump size is 50 µm. The similar thing calculation applies to cases in which the bump size is 20-40 µm. Here, the contact dimension Vmin. is set to have 14% of the bump size. The contact dimension Vmax. is set to have 40% of the bump size, and the contact dimension V (Vave.) is given by an equation (Vmin.+Vmax.)/2=Vave.

The amount of sliding W of the contact portion 25 is set to be 10 µm. This value of 10 µm is one of examples. The amount of sliding W of the contact portion 25 is set according to various conditions such as a size of the electrical contact 20, pressing force etc. At least, it is set so that X3, which will be described later, can be provide at the front side and the back side in a sliding direction of the contact portion 25.

The specific values of this amount of sliding W is shown in FIG. 8. The values are examples in a case in which the bump size is 50 µm. The similar calculation can be applied in cases in which the bump size is 20-40 µm. Here, An amount of sliding Wmax. is set to have the same dimension as the dimension of the above described contact dimension Vmax. An amount of sliding Wmin. is set to have one-fourth of the amount of sliding Wmax, and the amount of sliding Wave. is set to have one-second of the amount of sliding Wmax.

The Additional element X is a value including at least positional accuracy X1 of the contact portion 25. As this additional element X, various elements can be included. For example, in addition to the positional accuracy X1, the following dimension tolerance X2 can be added. That is, dimension tolerance X2 such as size differences between the electrical contacts 20 and between the contact portions 25, a tolerance of attaching the electrical contactor 20, and a dimension tolerance such as dimension accuracy required by clients etc. Also, the sum of clearance Z1 from the end portion on the front end side in the sliding direction of contactor 25 to the contact surface (see FIG. 6(*a*)) in starting contact starts and clearance Z2 from the end portion on the back end side in the sliding direction of the contactor 25 of in ending contact X3 (=X1+X2) can be included.

Other than X1–X3, there are elements that displace the contact portion 25 of the electrical contactor 20, depending on each of the inspection apparatus and the like, so those elements are also included in the additional element X.

The positional accuracy X1 of the contact portion 25 is set to be 12 µm. This value of 12 µm is, similar to the amount of sliding W of the contact portion, one of examples. The positional accuracy X1 is determined according to various conditions such as a size of a probe card etc. that supports the electrical contactor 20 and its accuracy and the like.

The dimension tolerance X2 of the contact portion 25 is set to be 4 µm. This value is the difference between the maximum value and the minimum value that can be allowed, and is set according to various conditions such as the size of the electrical contactor 20 etc.

Also, X3 which is the sum of clearance Z1 from the end portion on the front end side in the sliding direction of contactor 25 to the contact surface (see FIG. 6(a)) in starting contact and clearance Z2 from the end portion on the back end side in the sliding direction of the contactor 25 of ending contact is set to be 10 μm. This X3 which is the sum of clearances is set to have a value so that the contact portion 25 is not displaced out of the contact surface of the bump electrode 27 even if the contact portion 25 is displaced at the start of contact or at the end of contact. Specifically, it is set to have the maximum value of possible displacement of the contact portion 25, and the tolerance of the contact portion 25 is allowed.

The allowable range of the dimension S1 of the contact portion 25 calculated as above is determined in a constant range. Specifically, the minimum value of the dimension S1 is approximately 13 μm when the bump size is 20 μm, and approximately 33 μm when the bump size is 50 μm, and they are in proportion to each other. The minimum value of the dimension S1 here is a value when all the elements of the additional element X are at minimum value. Also, the maximum value of the dimension S1 is approximately 39 μm when the bump size is 20 μm, and approximately 86 μm when the bump size is 50, and they are in proportion to each other. The maximum value of the dimension S1 here is a value when all the elements of the additional element X are at maximum value. The average value of these is approximately 21 μm when the bump size is 20 μm, and 54 μm when the bump size is 50 μm, and they are in proportion to each other.

As a result, the contact portion 25 has a planar surface whose area is as large as or larger than approximately one-fourth of an area of the plane surface (the maximum area of the bump electrode 27 seen from the above) of the bump electrode 27 which is the terminal of the electronic device (see FIG. 6). Here, as the bump electrode 27 of the electronic device has a circular shape, the contact portion 25 is formed to have a shape as large as or larger than the circular shape whose diameter is proximately r, in contrast to the circular-shape bump electrode 27 whose plane shape is diameter 2r. As the contact portion 25 has a quadrilateral-shaped surface, the dimension of each side is set to be more than r. In addition, the maximum area of the distal end portion of the main body 24 is set within a range not to contact with the adjacent electrical contactors 20.

When the bump electrode 27 is crushed by this contact portion 25, an area of the distal end portion (upper end portion) of the bump electrode 27 being crushed is set to have an area approximately one-fourth of the area of the plane surface of the bump electrode 27 (the maximum area of the bump electrode 27 seen from the above). The size of the crashed area (a diameter S2) satisfies S2<S1−X3.

The contact portion 25 is plated. The thickness and width of plating is set in accordance with the size of the bump electrode 27. The width and the pitch of the bump electrode 27 vary depending on a type of electronic devices and the like. Therefore, the thickness and width of plating (of the contact portion 25) is set in accordance with a bump electrode 27 of the electronic devices.

Figure 10:
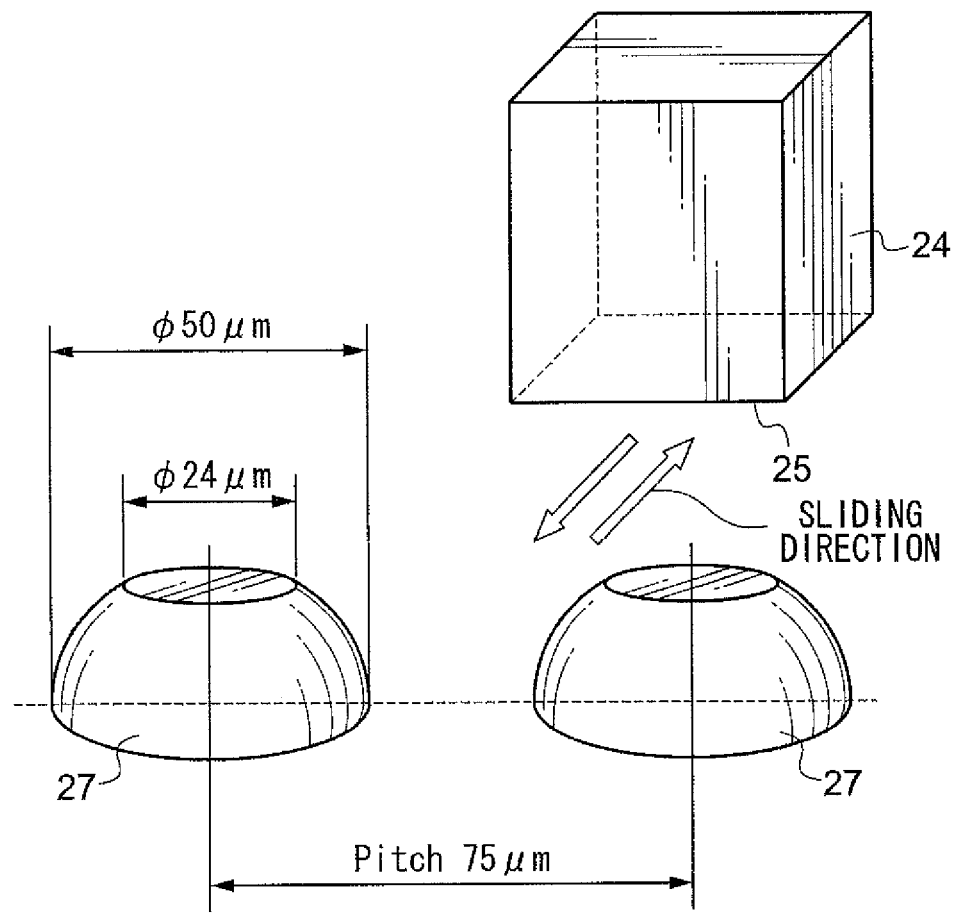
FIG. 10 is a schematic view showing a contact method for an electrical contactor according to an embodiment of the present invention with reference to specific sizes.

In FIG. 10, an example of the specific dimension is shown. The bump electrode 27 is circular-shaped with diameter 50 μm. The dimension of the area being crushed on the upper end portion of the bump electrode 27 is 24 μm in diameter. Pitch of each of the bump electrodes 27 is 75 μm.

High hardness materials are used as the plating. As the contact portion 25 and the bump electrode 27 rub against each other, the contact portion 25 is plated using high hardness materials good in abrasion resistance. As high hardness materials, rhodium (Rh), iridium (Ir) and the like can be used.

(B) Contact Method for Electrical Contactor

Next, a contact method to contact with the bump electrode 27 using the electrical contactor 20 constituted as above is describe based on FIG. 10. It is to be noted that the bump electrode 27 as shown in FIG. 10 is shown in a state where its upper end portion is crushed by the contact portion 25.

The planar surface shape contact portion 25 of the main body distal end, with its attachment portion 25 which is the base end portion of the main body of the electrical contactor 20 supported, presses the bump electrode 27 which is a terminal provided on the surface of the electronic device and electrical connection is achieved.

The contact portion 25 on the planar surface of the electrical contactor 20 always contacts with a top of the bump electrodes 27 which have spherical surface. That is, Even if the electrical contactor 20 is displaced somewhat, the contact portion 25 on the planar surface does not be displaced from the top of the bump electrode 27, and the contact portion 25 on the planar surface always contacts the top of the bump electrodes 27.

This also applies to a bump electrode which has shape other than spherical shape, and the contact portion 25 on the planar surface always contacts with the top of the bump electrodes 27.

In this state, the contact portion 25 crushes the bump terminal and pressed so as to form a planar surface whose area is approximately one-fourth of the area of the planar surface of the bump electrode 27 (are of the bottom surface) on the top portion of the bump electrode 27.

Specifically, as the planar shape of the bump electrode 27 is circular shape, the pressing is done to form a planar surface having an area as wide as an area of a circle with a diameter r, with respect to a diameter 2r of the bump electrode 27 having circular shape. By moving The semiconductor device 2 using the inspection stage 6, the upper end portion of the bump electrode 27 is pressed onto the contact portion 25, and pressing onto the upper end portion of the bump electrode 27 is performed to form a planar surface (a circle having a diameter S2<S1−X3) with an area approximately one-fourth of an area of the planar surface (area of a circle with a diameter 50 μm) of the bump electrode 27. Here, Pressing is performed to form a circular shape having a diameter of 24 μm.

At this time, by making the dimension of the contact portion 25 S1, displacement at the contact portion 25 is allowed. Specifically, by displacing the semiconductor device 2 on the inspection stage 6 in a horizontal direction (XY direction), the contact portion 25 and the bump electrode 25 are displaced relatively to rub against each other. That is, as shown in FIG. 6, the contact portion 25 and the bump electrode 27 are slid relatively in a direction perpendicular to the direction in which the contact portion 25 presses the bump electrode 27 to rub against each other. AS a result, oxide film on the surface of the bump electrode 27 is removed and contact is achieved. For example, the semiconductor device 2 is moved reciprocally by the inspection stage 6, and thereby the contact portion 25 and the bump electrode 27 rub against each other so that the oxide film is removed, and connection is achieved. In this case, the side of the bump electrode 27 is made to slide, but the contact portion 25 side of the electrical contactor 20 may be made to slide.

As a result, the contact portion 25 is pressed onto the bump electrode 27 with low pressure and brought into firm electrical contact with each other, and an inspection signal and the like is applied.

As described above, because the contact portion 25 of the electrical contactor 20 is formed to have a planar surface shape with the dimension of S2, the contact portion 25 will not be displaced and fall from the bump electrode with spherical surface, when the contact portion 25 of the electrical contactor 20 contacts with the bump electrode 27, and can be brought into firm contact with the bump electrode without giving serious damage.

As a result, the contact portion of the electrical contactor 20 will not be bent or broken, and the cycle of maintenance can be widely extended.

Moreover, because the oxide film on the surface of the bump electrode 27 is removed and contact is achieved by making the contact portion 25 be displaced and rub against the bump electrode 27, the oxide film can be removed with low pressure, and the contact portion 25 and the bump electrode 27 can be brought into firm electrical contact with each other.

Accordingly, electrical conduction with high reliability between the contact portion 25 and the bump electrode 27 can be achieved.

As a result, a probability of recognition error can be reduced, and the implementation failure in a welding process of the bump electrode 27 can be reduced. As a result, operability is increased, and the electronic device is implemented without fail. Furthermore, the quality of the connection part is improved, and reliability to the implemented products is also increased.

Also, because the contact portion 25 is plated using high hardness materials, cases of adhesion of foreign matters such as solder scraps are reduced even when pressed onto the bump electrode 27. Thus, the cycle of maintenance for cleaning the scraps can be greatly extended, and inspection efficiency can be improved.

Also, even if the size and the pitch of the bump electrode 27 are changed, it can deal with the bump electrode 27 the size and the pitch of which are changed.

(C) Variations

In the above-described embodiment, although cantilever type electrical contactor 20 is described as an example, the present invention may also be applied to other type of electrical contactors 20 such as contact probe type etc. In these cases as well, functions and effects similar can be exerted.

In the above-described embodiments, although the case in which the planar shape of the bump electrode 27 is a circular shape is described, the bump electrode may have other shapes. For example, it may have a polygonal shape such as a triangle shape or a quadrilateral shape, or it may have other shapes such as an ellipse shape etc. In those cases as well, functions and effects similar to those of the above-described embodiment can be exerted.

The present invention is not limited to the above-described embodiment but includes various modifications that could have been conceived of by those skilled in the art, and the effects of the present invention are also not limited to the contents described above. That is, various addition, changes, partial deletion and the like within a range not departing from the conceptual idea and the gist of the present invention derived from the contents specified in claims and the equivalents thereof are possible.

The invention claimed is:

1. An electrical contactor in which a contact portion on a distal end of a main body is, with its base end of the main body supported, pressed onto a terminal provided on a surface of an electronic device and electrically connected, characterized in that,
   when a dimension in a sliding direction of the contact portion is defined as S1, said contact portion being in contact with the terminal of the electronic device,
   an average value of a dimension of contact between the contact portion and the terminal of the electronic device in a contact starting position and the dimension of the contact in a contact end position is defined as V,
   an amount of sliding of the contact portion is defined as W, and
   an additional value is defined as X, the additional value X including at least a positional accuracy of the contact portion and a sum of a clearance of the contactor from an end portion on a front side in a sliding direction to a contact surface in the contact starting position and a clearance of the contactor from an end portion on a back end side in the sliding direction to the contact surface in the contact end position,
   the dimension of the contact portion S1 is set to satisfy a relationship of S1>V+W+X.

2. The electrical contactor according to claim 1, wherein the dimension of the contact portion S1 is set within a range not to contact with adjacent electrical contactors.

3. The electrical contactor according to claim 1, wherein a minimum value Vmin. of the contact dimension V of the contact portion and the terminal of the electronic device is 14% of the terminal size.

4. The electrical contactor according to claim 1, wherein a maximum value Vmax. of the contact dimension V of the contact portion and the terminal of the electronic device is 40% of the terminal size.

5. The electrical contactor according to claim 1, wherein a shape of the terminal of the electronic device is circular, polygonal, or elliptical.

* * * * *